United States Patent [19]

Schaber et al.

[11] Patent Number: 4,829,015
[45] Date of Patent: May 9, 1989

[54] METHOD FOR MANUFACTURING A FULLY SELF-ADJUSTED BIPOLAR TRANSISTOR

[75] Inventors: Hans-Christian Schaber, Unterpfaffenhofen; Hans-Willi Meul, Steinhoering, both of Fed. Rep. of Germany

[73] Assignee: Siemens Aktiengesellschaft, Berlin and Munich, Fed. Rep. of Germany

[21] Appl. No.: 170,897

[22] Filed: Mar. 21, 1988

[30] Foreign Application Priority Data

May 21, 1987 [DE] Fed. Rep. of Germany ....... 3717153

[51] Int. Cl.$^4$ ........................................... H01L 21/265
[52] U.S. Cl. ....................................... 437/31; 437/33; 437/67; 437/193; 148/DIG. 10; 148/DIG. 11; 148/DIG. 117; 357/34; 357/59; 156/653
[58] Field of Search ...................... 437/31, 32, 33, 64, 437/67, 68, 38, 193, 233, 238, 241; 148/DIG. 10, DIG. 11, DIG. 117; 357/34, 35, 59 H; 156/643, 653, 657

[56] References Cited

U.S. PATENT DOCUMENTS

| T104,803 | 11/1984 | Horng | 357/34 |
| 4,378,630 | 4/1983 | Horng | 437/33 |
| 4,392,149 | 7/1983 | Horng | 357/49 |
| 4,745,087 | 5/1988 | Iranmanesh | 437/33 |

FOREIGN PATENT DOCUMENTS

| 0029900 | 6/1981 | European Pat. Off. . |
| 0036499 | 9/1981 | European Pat. Off. . |
| 0039411 | 11/1981 | European Pat. Off. . |
| 0062170 | 10/1982 | European Pat. Off. . |
| 0094482 | 11/1983 | European Pat. Off. . |
| 0166923 | 1/1986 | European Pat. Off. . |

OTHER PUBLICATIONS

Siemens Forsch–u. Entwickl.–Ber., vol. 13 (1984), No. 5, "Self-Aligned Bipolar Technology–New Chances for Very–High–Speed Digital Integrated Circuits", by A. W. Wieder, pp. 246–252.
IEDM Techn. Dig. 1980, pp. 58–60, "A Symmetrical Bipolar Structure", by D. D. Tang et al.
IEEE Transactions on Electron Devices, vol. ED–29, No. 4, Apr., 1982, "Self-Aligned Transistor with Sidewall Base Electrode", by Tohru Nakamura et al., pp. 596–600.

Primary Examiner—Brian E. Hearn
Assistant Examiner—Kevin McAndrews
Attorney, Agent, or Firm—Hill, Van Santen, Steadman & Simpson

[57] ABSTRACT

A method for manufacturing a fully self-adjustsed bipolar transistor in which the emitter zone, the base zone, and the collector zone are aligned vertically in a silicon substrate; the collector is connected by means of a deeply extending terminal in the substrate, the inactive base zone is embedded in an insulating trench to separate the inactive base zone from the collector; the emitter terminal zone is composed of doped polycrystalline silicon and is separated from the inactive base zone by a silicon oxide layer. A fully self-adjusted bipolar transistor is produced wherein the emitter is self-adjusted relative to the base and the base is self-adjusted relative to the insulation. The number of method steps involving critical mask usage is low, and parasitic regions are minimized so that the switching speed of the component is increased. The transistor is used for integrated bipolar transistor circuits having high switching speeds.

6 Claims, 3 Drawing Sheets

METHOD FOR MANUFACTURING A FULLY SELF-ADJUSTED BIPOLAR TRANSISTOR

BACKGROUND OF THE INVENTION

Field of the Invention

The present invention is directed to a method for manufacturing a fully self-adjusted bipolar transistor of the npn type which is integrated into a semiconductor circuit on a silicon substrate.

DESCRIPTION OF THE PRIOR ART

A reduction of transistor dimensions in integrated bipolar transistor circuits not only provides higher packing densities, but also serves to improve the switching speed. The switching time of a vertical npn transistor is essentially determined by the base-collector capacitance that is dominated by parasitic regions. These regions are caused both by the base contact zone, known as the inactive base zone, as well as by adjustment tolerances in various photoresist techniques. An elimination of these parasitic zones would greatly enhance the switching speed. However, this succeeds only to a certain degree on the basis of simple size reduction of the structures, i.e., scaling down.

The prior art processes have been devised which are known as self-adjustment processes and they provide decided improvement in the reduction of parasitic zones. Such processes are described, for example, in an article by Wieder in Siemens Forschungs-Und Entwicklungsberichten, Volume 13 (1984) No. 5, pages 246–252. That article is incorporated herein by reference. In the bipolar transistor structure shown in FIG. 5 of the article, the emitter is made self-adjusted relative to the base.

SUMMARY OF THE INVENTION

The present invention provides a method for manufacturing a fully self-adjusted bipolar transistor with a minimum emitter area and minimum parasitic regions, wherein the base terminal is designed such that it does not come into contact with the collector zone insofar as possible. In particular, the present invention provides a method which requires only few critical and mask involving method steps.

Essentially two methods are known from the prior art to produce self-adjusted transistors with minimum parasitic regions. A self-adjusted, symmetrical bipolar transistor which is especially suitable for I$^2$L circuits is proposed in an article by Tang et al in IEDM Technical Digest 1980, pages 58–60. The active regions of this transistor are produced by epitaxial depositions.

What is referred to as the SICOS process (sidewall base contact in silicon) is described by Nakamura et al in IEEE Transaction of Electron Devices, Vol. ED-29 (1982) No. 4, pages 596–600. This structure is built up on a mesa etching structure, wherein, just as in Tang, the base terminal zone composed of polysilicon lies on a buried SiO$_2$ layer and the active base is contacted by the sidewall. The base is self-adjusted relative to the insulation in both methods.

The present invention achieves the objective in a different way and is characterized by a method consisting of the following method steps, in sequence:

(a) an n$^+$ doped layer is ion implanted in a p-doped silicon substrate, (b) an n-doped epitaxial silicon layer is applied over the n$^+$ doped layer, (c) a silicon oxide layer is thermally grown over the epitaxial silicon layer, (d) a silicon nitride layer is grown over the silicon oxide layer, (e) a first oxide layer is applied to serve as a first etching mask, the mask defining areas for the formation of insulating trenches which separate the active zones of the transistor, (f) the resulting structure is etched to form the trenches, the etching extending through the epitaxial layer down to the n$^+$ doped layer on the substrate, (g) a second etching mask is applied on the first oxide layer while covering the trench separating the desired emitter-base zone from the desired collector terminal region, (h) the remaining trenches are etched down into the substrate, (i) p-ions are implanted in the remaining trenches to produce p$^+$ channel regions, (j) the first and second etching masks are removed, (k) each of the trenches is filled with an insulating oxide, (l) a third etching mask is applied such that the desired collector terminal region remains free, (m) the desired collector terminal region is implanted with n$^+$ ions through the silicon nitride and silicon oxide layers, (n) the third etching mask is removed, (o) a fourth etching mask is applied such that the base terminal region including the desired emitter region is uncovered, (p) the insulating oxide from the trench is partially removed in the desired base terminal region by etching, the silicon nitride layer located on the desired emitter region serving as an etching mask, (q) the fourth etching mask is removed, (r) the region which erodes due to removal of the oxide layer is filled with p$^+$ doped polysilicon, (s) the resulting p$^+$ doped polysilicon is back-etched to planarize the surface, (t) an insulating oxide is generated between the desired base terminal and the desired emitter terminal with the silicon nitride layer in the later formed emitter region serving as a mask, (u) the first silicon oxide layer and the silicon nitride layer are removed, (v) p-ions are implanted to generate an active base zone, (w) an n$^+$ doped polysilicon layer is deposited, (x) the layer of step (w) is structured with a fifth etching mask to form an emitter terminal and a collector terminal, (y) the resulting surface is anisotropically etched to remove the fifth etching mask and the locally generated oxide layer which is not covered by the n$^+$ doped emitter terminal region, the anisotropic etching being selective to silicon, and (z) an insulating layer is applied between the active region and the conventional finishing steps are then carried out.

Other features of the invention include the steps of thermally decomposing a compound containing silicon and oxygen to form an oxide layer, and generating the first etching mask from the oxide layer by a photoresist method and anisotropic etching. The thickness of the mask is preferably about 400 nm. The trench etching is carried out to a depth of about 1 um. The partial removal of the insulating oxide layer occurs to a depth of about 0.4 to 0.5 um.

In another preferred embodiment the walls of the trenches are thermally oxidized to a thickness of about 50 nm before the trenches are filled with the insulating oxide.

BRIEF DESCRIPTION OF THE DRAWINGS

The present invention which combines the idea of a sidewall base contact with the idea of trenching insulation is set forth in greater detail below with reference to an exemplary embodiment directed to a vertical bipolar transistor of the npn type.

DESCRIPTION OF THE PREFERRED EMBODIMENTS

Figure 1:
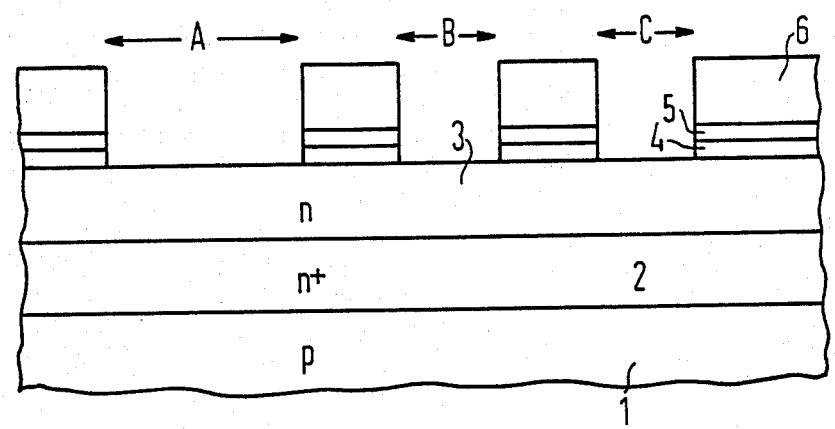
FIGS. 1 to 8 inclusive illustrate sections of the method steps which are critical to the invention for the manufacture thereof, with identical reference characters being applied to identical parts.

The arrangement shown in FIG. 1 is produced by the following method steps which are known in and of themselves from the prior art, specifically the initial steps. For a description of the initial steps, references invited to the aforementioned Wieder article, pages 246-252.

A buried collector region 2 in a p-doped silicon substrate 1 is formed by ion implantation of n+ doping ions (arsenic or antimony) with a dosage and energy level of $3 \times 10^{15}$ cm$^{-2}$, or $2 \times 10^{16}$ cm$^{-2}$ and 80 keV. Next, an n-doped epitaxial layer 3 is deposited to a concentration of 1 to $3 \times 10^{16}$ cm$^{-3}$. As in a thickness of from 0.5 to 2 um. Next, a thermally grown, thin silicon oxide layer 4 is generated, and a silicon nitride layer 5 of about 100 nm is formed thereon by a thermal decomposition of compounds containing silicon and oxygen in the presence of ammonia, the silicon nitride layer being produced at low pressure.

The first etching mask 6 is then applied, the mask being composed, for example, of silicon oxide and resulting from surface-wide deposition of silicon oxide from thermally decomposed tetraethylorthosilicate and structured by means of a photoresist technique to produce regions A, B, C which are in the areas in which insulation trenches are to be produced. The regions A, B, and C are then etched down to the surface of the epitaxial layer 3 by means of known dry etching methods.

Due to the definition of the regions A, B, and C, the position and dimensions of all the electrically active transistor regions is already determined, making it a fully self-adjusted transistor.

Figure 2:
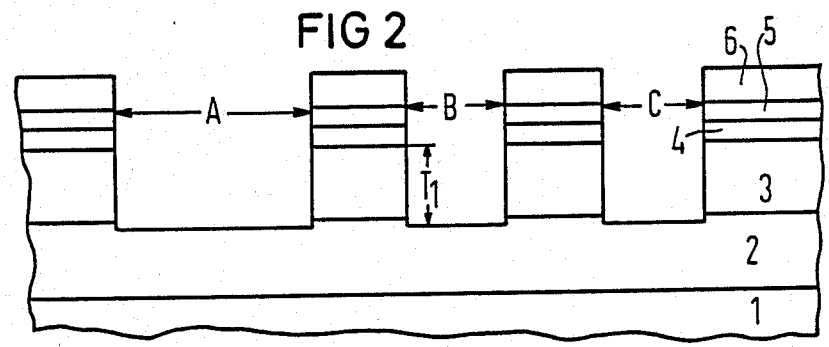

Refering to FIG. 2, after removal of the photoresist mask the trench etching in regions A, B and C is carried out through the epitaxial layer 3, down to a trench depth $T_1$ such that the epitaxial layer 3 is interrupted.

Figure 3:
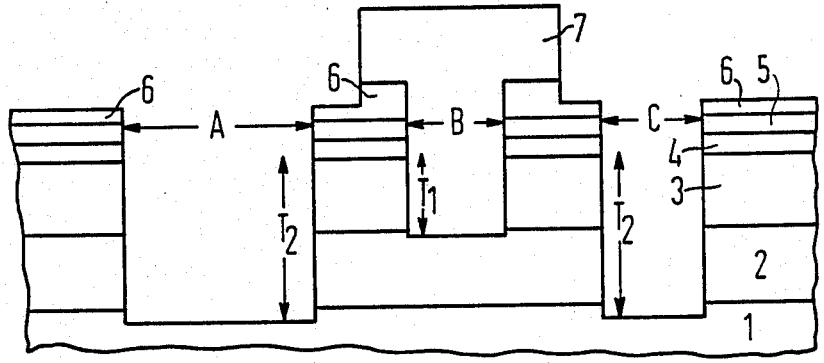

As shown in FIG. 3, after the initial trench etching, the trench region B is covered with a second etching mask 7 composed, for example, of photoresist material, and whose fixing is non-critical. The trenches A and C are etched into the substrate 1 down to a depth $T_2$ of about 3 to 4 um.

Figure 4:
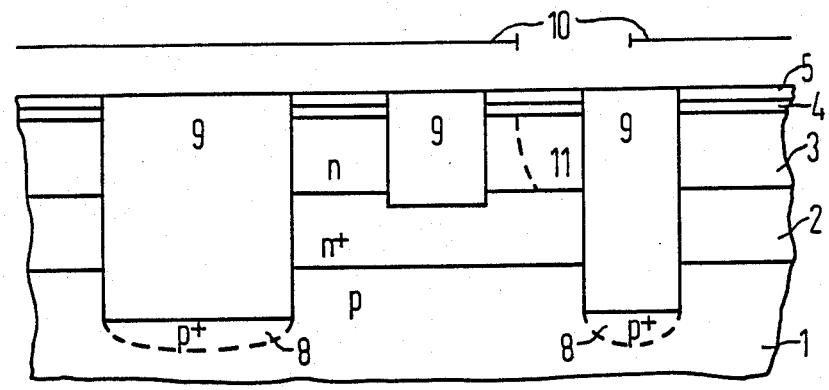

After the conclusion of the trench etching processes, a boron ion implantation is carried out for generating p+ channel stopper regions 8 as shown in FIG. 4. These regions have the function of providing a reliable insulation between neighboring collector regions, thereby avoiding a parasitic thick oxide transistor. The photoresist mask 7 and the residues of the etching mask 6 are then removed. All of the trenches A, B, and C are passivated with a roughly 50 nm thick, thermally grown oxide (not shown) and are subsequently filled with an insulating oxide 9.

Each of the trenches has a constant width which we will call W so that the filling of the trenches will be accomplished by the deposition of an SiO$_2$ layer having a thickness greater than W/2.

Employing another non-critical, third photoresist mask illustrated by the line 10, a collector terminal zone 11 is now produced by a high energy ion implantation and diffusion (not shown) passing through the layers 4 and 5.

Figure 5:
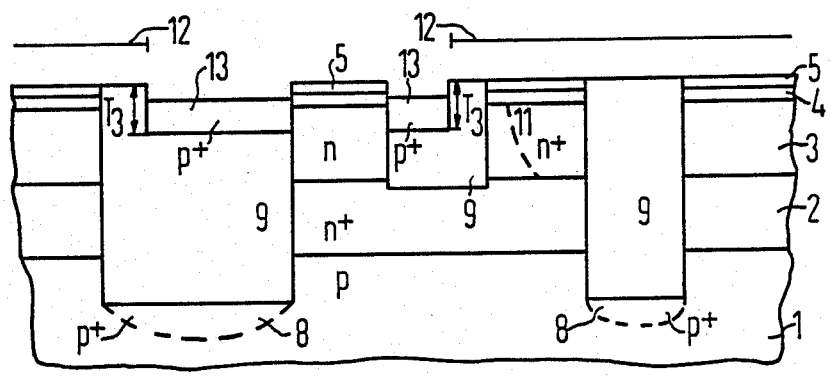

FIG. 5 illustrates the self-adjustment steps of the invention which generate the bipolar transistor in self-adjusted fashion relative to the insulating trenches A and B. After the removal of the third photoresist mask 10, a fourth photoresist mask 12 is first applied for manufacturing the base terminal. With the photoresist mask 12 and the nitride layer 5 lying above the proposed emitter region, the oxide 9 is partially etched out of the trenches A and B that surround the potential emitter, the etching being carried down to a depth $T_3$ of 0.4 to 0.5 um. After the removal of the fourth, non-critical photoresist mask 12, the annular region in the trench (A, B) is filled up with p+ doped polysilicon 13 and is planarized by re-etching or back-etching. The p+ polysilicon surface 13 should thereby be lowered somewhat as shown in FIG. 5 by the over-etching. The local oxidation which follows to a depth of approximately 300 nm does not produce excessively pronounced surface steps but also extends deeply enough into the polycrystalline region 13 as shown in FIG. 6.

Figure 6:
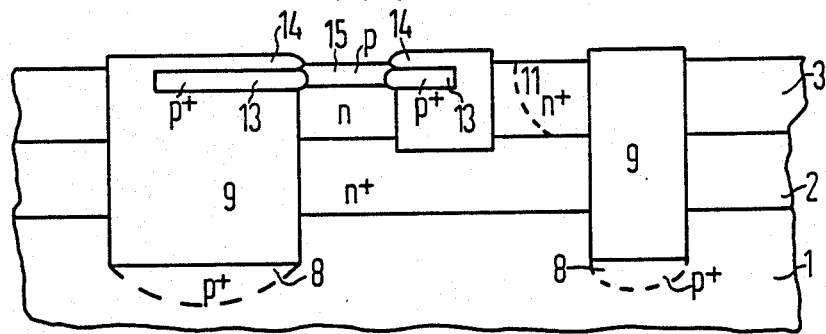

As shown in FIG. 6, the locally generated oxide 14 permits the self-adjustment of the emitter relative to the base in the further progress of the process. The nitride layer 5 and the oxide layer 4 are removed and the active base zone 15 is generated without masking by a boron ion implantation.

Figure 7:
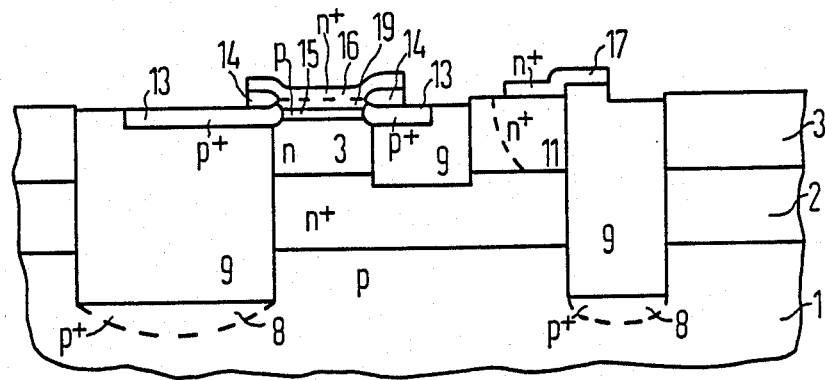

Referring to FIG. 7, an n+ doped polysilicon deposition to a thickness of about 100 nm is then carried out. This layer is structured in an anisotropic etching process through the use of a fifth non-critical photoresist technique (not shown) and the emitter terminal zone 16 and the collector terminal 17 are thus formed. The emitter zone 19 is formed by subsequent out-diffusion, and is formed self-adjusted relative to the base.

After removal of the fifth photoresist, the uncovered, locally generated oxide is anisotropically etched using an etching process that has a high selectivity to silicon.

As may be seen from FIG. 7, the described process can be used for generating lateral pnp transistors that can accumulate practically no stored charge under the p+ regions without base implantation and in a vertically aligned structure.

Figure 8:
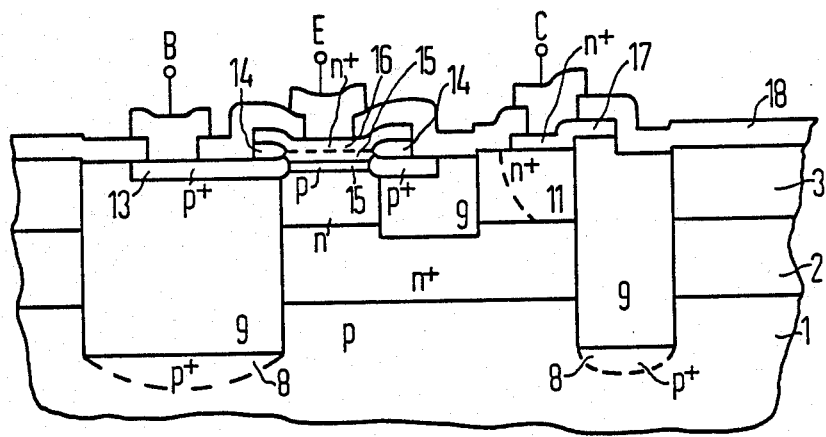

FIG. 8 illustrates the bipolar transistor structure of the invention when finished in accordance with known method steps of semiconductor technology. An intermediate insulating layer of about 200 nm thickness is identified at reference character 18 and the contacts for the base, emitter and collector are identified at B, E and C.

It will be evident that various modifications can be made to the described embodiments without departing from the scope of the present invention.

We claim as our invention:

1. A method for manufacturing a self-adjusted bipolar transistor of the npn type on a silicon substrate and having vertically aligned emitter, base and collector zones in said substrate which comprises the following steps in the sequence given:
   (a) ion implanting an n+ doped layer in a p-doped silicon substrate,
   (b) applying an n-doped epitaxial silicon layer over said n+ doped layer,
   (c) thermally growing a silicon oxide layer over said epitaxial silicon layer,
   (d) growing a silicon nitride layer over said silicon oxide layer,
   (e) applying a first oxide layer to serve as a first etching mask, said mask defining areas for the formation of insulating trenches which separate the active zones of the transistor,
   (f) etching the resulting structure to form said trenches, said etching extending through said epitaxial layer down to said n+ doped layer in said substrate,
   (g) applying a second etching mask on said first oxide layer while covering the trench separating the desired emitter-base zone from the desired collector terminal region,
   (h) etching the remaining trenches down into said substrate,
   (i) implanting p-ions in said remaining trenches to produce p+ channel regions,
   (j) removing said first and second etching masks,
   (k) filling each of the said trenches with an insulating oxide,
   (l) applying a third etching mask such that the desired collector terminal region remains free,
   (m) implanting the desired collector terminal region with n+ ions through said silicon nitride and silicon oxide layers,
   (n) removing said third etching mask,
   (o) applying a fourth etching mask such that the base terminal region including the desired emitter region is uncovered,
   (p) partially removing the insulating oxide from the trench in the desired base terminal region by etching, the silicon nitride layer located on the desired emitter region serving as an etching mask,
   (q) removing said fourth etching mask,
   (r) filling up the region which erodes due to removal of said oxide layer with p+ doped polysilicon,
   (s) back-etching the resulting p+ doped polysilicon to planarize the surface,
   (t) generating an insulating oxide between the desired base terminal and the desired emitter terminal with said silicon nitride layer in the later formed emitter region serving as a mask,
   (u) removing said first silicon oxide layer and said silicon nitride layer,
   (v) implanting p-ions to generate an active base zone,
   (w) depositing an n+ doped polysilicon layer,
   (x) structuring the layer of step (w) with a fifth etching mask to form an emitter terminal and a collector terminal,
   (y) anisotropically etching the resulting surface to remove said fifth etching mask and the locally generated oxide layer which is not covered by the n+ doped emitter terminal region, the anisotropic etching being selective to silicon, and
   (z) applying an insulating layer between the active regions.

2. A method according to claim 1 which includes the steps of thermally decomposing a compound containing silicon and oxygen to form an oxide layer, and generating said first etching mask from said oxide layer by a photoresist method and anisotropic etching.

3. A method according to claim 2 wherein the thickness of said mask is about 400 nm.

4. A method according to claim 1 wherein the trench etching of step (f) is carried out to a depth of about 1 um.

5. A method according to claim 1 wherein the partial removal of said insulating oxide layer of step (p) occurs to a depth of about 0.4 to 0.5 um.

6. A method according to claim 1 wherein the walls of the trenches are thermally oxidized to a thickness of about 50 nm before the trenches are filled with an insulating oxide in step (k).

* * * * *